US006345380B1

(12) United States Patent
Bonaccio et al.

(10) Patent No.: US 6,345,380 B1
(45) Date of Patent: Feb. 5, 2002

(54) INTERCONNECTED INTEGRATED CIRCUITS HAVING REDUCED INDUCTANCE DURING SWITCHING AND A METHOD OF INTERCONNECTING SUCH CIRCUITS

(75) Inventors: Anthony R. Bonaccio, Shelburne; Howard Kalter, Colchester; William R. Tonti, Essex Junction, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/303,289

(22) Filed: Apr. 30, 1999

(51) Int. Cl.[7] ............................................... G06F 17/50
(52) U.S. Cl. ............................................. 716/12; 716/1
(58) Field of Search ......................... 716/12, 1; 326/26, 326/27, 80, 83, 122

(56) References Cited

U.S. PATENT DOCUMENTS

| 4,916,599 | A | * | 4/1990 | Traxler et al. ................. 363/65 |
| 5,124,579 | A | * | 6/1992 | Naghshineh .................. 326/27 |
| 5,311,081 | A | | 5/1994 | Donaldson et al. ............ 326/62 |
| 5,315,172 | A | | 5/1994 | Reddy .......................... 326/27 |
| 5,316,206 | A | | 5/1994 | Hanibuchi et al. ........... 228/183 |
| 5,347,179 | A | * | 9/1994 | Casper et al. ................. 326/122 |
| 5,521,536 | A | * | 5/1996 | Yamashita et al. ............. 326/82 |
| 5,568,081 | A | | 10/1996 | Lui et al. ...................... 327/380 |
| 5,742,495 | A | * | 4/1998 | Barone ......................... 363/65 |
| 5,760,571 | A | * | 6/1998 | Latham, II et al. .......... 323/274 |
| 5,889,395 | A | * | 3/1999 | Lundberg .................... 323/313 |

OTHER PUBLICATIONS

Chen et al, "Interconnect and Circuit Modeling Techniques for Full–Chip Power Supply Noise Analysis", IEEE, Aug. 1998, pp. 209–215.*

Choy et al, "A Feedback Control Circuit Design Technique to Suppress Power Noise in High Speed Output Driver," IEEE, May 1995, pp. 307–310.*
Senthinathan et al, "Application Specific CMOS Output Driver Circuit Design Techniques to Reduce Simultaneous Switching Noise," IEEE, Dec. 1993, pp. 1383–1388.*
Lou et al, "A 1.5–V Full–Swing Bootstrapped CMOS Large Capacitance–Load Driver Circuit Suitable for Low–Voltage CMOS VLSI," IEEE, Jan. 1997, pp. 119–121.*
Chi et al, "Process, Voltage and Temperature Compression of Off–Chip–Driver Circuits for Sub–0.25–UM CMOS Technology," IEEE, Sep. 1997, pp. 279–282.*
Gabara et al. High Speed Digital Circuit Techniques, Feb. 17, 1988,1988 IEEE International Solid State Circuits Conference.

* cited by examiner

Primary Examiner—Matthew Smith
Assistant Examiner—Vuthe Siek
(74) Attorney, Agent, or Firm—Francis J. Thornton; Robert A. Walsh

(57) ABSTRACT

The disclosed invention provides a reduction of voltage noise or bounce in logic chips and does so in a practical way without requiting additional circuit elements that impact on circuit performance or speed. Broadly this reduction in voltage bounce is achieved by forcing the unused Input/Output (I/O) circuits, i.e., those chips not being activated, to serve as alterative paths to the voltage power supply used by the switching circuits. More particularly this is accomplished this by grouping the I/O points on the chips into logical, functional units such as data buses, control lines, the I/O points on switched circuits, i.e., those switched at high frequency and the I/O points on static circuits, i.e., non-switched and interconnecting and using the I/O points on the static circuits and the power supply drives coupled thereto as alternate pats to the power supply used by the switched circuits. In this way the inductance in the switched power supplies can be substantially reduced such that voltage bounce in the circuit is substantially reduced without adversely impacting on circuit speed.

10 Claims, 7 Drawing Sheets

INTERCONNECTED INTEGRATED CIRCUITS HAVING REDUCED INDUCTANCE DURING SWITCHING AND A METHOD OF INTERCONNECTING SUCH CIRCUITS

FIELD OF THE INVENTION

This invention relates generally to integrated semiconductor circuits, and more particularly to a plurality of interconnected integrated semiconductor circuits and chips in a microprocessor arranged to have reduced inductance during switching of one or more of the circuits and to a method for interconnecting such circuits and chips such that the inductance of the switched circuits will be reduced.

BACKGROUND OF THE INVENTION

Modem computers utilize large numbers of semiconductor chips that include logic circuits such as AND, OR, NAND, NOR, etc. Because of the large numbers of logic circuits required in modern computers it is often necessary that a number of such logic circuit chips be used. Such logic circuit chips typically include a plurality of logic circuits each of which is provided with a respective driver circuit and a respective Input/Output ( I/O ) circuit point or contact such as a pin or a pad. During operation of the computer many of these individual logic circuits in a chip are required by the computer processor to switch on simultaneously while other logic circuits in the same chips are held or remain off. As each required circuit switches on, an output current is applied to its respective I/O point. However, because each such I/O point has a load capacitance associated therewith, the current required to charge and discharge this load capacitance must flow from the driver power supply associated with the logic circuit being turned on. The driver power supply, so affected, further has some finite inductance associated with its power supply leads and the current required to charge and discharge the load capacitance connected to these I/O s points must necessarily also flow through this I/O point inductance in the I/O driver power supply lead. This inductance causes a change in the voltage at the I/O driver supply and creates a so-called voltage bounce proportional to the rate of change of the driver current and the supply inductance. If large numbers of drivers switch simultaneously and at high frequency, the resulting DC shift in the supply potential can degrade the noise margins on the chip. This becomes more significant as power supply voltages decrease.

There have been attempts in the past to control such a voltage noise or bounce in circuits.

In a paper entitled "Ground Bounce Control in CMOS Circuits" appearing in the "1988 IEEE International Solid State Circuits Conference Transactions," the problem of ground noise or bounce, due to the variation of the chip ground relative to the external ground, was discussed together with a proposed solution. This solution required having a control voltage source, tailored to the process creating the devices in the circuit, for regulating the charge discharge rate of a series transistor in the output buffer and thereby equalizing the delay, speed, rise/fall time and ground bounce of the CMOS output buffers, thus slow the faster element. This proposed solution is process dependent and cannot, for a number of practical purposes, be used in production.

U.S. Pat. No. 5,317,206 is also directed to an attempt to stabilize the voltage bounce within a circuit and does so by adding delay elements to the circuit being controlled. These delay elements are arranged to decrease the rising speed of the voltage at the circuit output which prevents current from flowing abruptly from the power supply which, in turn, reduces the voltage noise but does do by sacrificing circuit speed.

Similarly U.S. Pat. No. 5,315,172 added a pair of transistors serially connected between the voltage supply and ground with their common terminal connected to the circuit output so that, when either one of this serially connected pair is turned on, a slower rate of charge or discharge of the output occurs. This slower rate of charge or discharge of the output reduces the time rate of change of current through the circuit inductance and thereby reduces the voltage noise or bounce but again does do by sacrificing circuit speed.

U.S. Pat. No. 5,568,081 teaches the use of a variable slew rate control circuit for automatically adjusting the rate at which a node is driven to a voltage once again by sacrificing circuit speed.

This prior art did, of course, achieve an improvement in voltage noise or bounce but did so by introducing circuit elements which resulted in slower circuit performance times.

One of the hallmarks of the semiconductor industry has been and remains a demand for faster circuits, thus the industry will not accept any circuit changes that degrade the speed performance of the circuit. Therefore the industry will only accept, as a practical solution, a circuit change that will reduce voltage noise or voltage bounce that can be easily and inexpensively produced without sacrificing circuit speed or significantly impacting on other circuit performance criteria. Such a solution has long been sought by the industry without success.

The present invention achieves such a solution.

SUMMARY OF THE INVENTION

The present invention overcomes the above described problems encountered in reducing the problem of voltage noise or bounce in a computer during processor controlled activation or switching on of selected ones of the driver units in a computer and does so in a practical way without impacting on the performance or speed of the circuit being switched on.

Broadly this reduction in voltage bounce is achieved by forcing the Input/Output points, hereinafter referred to as I/O points, of static driver circuits, i.e., those driver circuits not being activated, to serve as alternative or additional voltage paths for the activated circuits.

The present invention accomplishes this by grouping the I/O points on the chips into logical, functional units such as data buses, control lines, power supply, etc.

In the present invention, the I/O points on a chip having a switched circuit, i.e., a circuit switched on at high frequency, and the I/O points on a chip having a static circuit, i.e., a circuit not switched on at high frequency, are selectively interconnected so that the switched circuit will be coupled to both its own local or on-chip power supplies and to the local or on-chip power supplies of a static circuit. By providing an alternate power supply path to the switched circuit, the inductance in the switched circuit and hence the voltage bounce is substantially reduced without adversely impacting on circuit speed.

This substantial reduction in induction and voltage bounce is achieved without adding circuit elements that will adversely alter the circuit speed.

The present invention thus relates to a system that includes a processor for selectively controlling a plurality of integrated circuit chips each of which is coupled to respective local or on-chip power supplies and to respective I/O points through one or more off chip drivers. One of the off chip drivers on each chip is provided with means, such as a latch, that will, when selected, interconnect the off chip driver circuits on the activated chip to the chip driver circuits local or on-chip power supplies on a different and inactive chip to reduce the inductance in the system and thereby reduce voltage bounce during the switching on of the activated chip.

The present invention is thus directed toward a method for interconnecting the first and second local or on-chip power supplies of a first chip, coupled to a first amplifier circuit coupled between a first integrated circuit and a first I/O signal path, to the first and second local or on-chip power supplies of a second chip, coupled to a second amplifier circuit coupled between a second integrated circuit and a second I/O signal path, to reduce the inductance between the first amplifier circuit and the first and second local or on-chip power supplies of the first chip during the activation or switching on of the first integrated circuit.

Accordingly, the present invention provides an improved integrated circuit system that has reduced noise bounce and inductance.

Further, the present invention provides an improved logic system that has lower noise bounce and lower inductance during the switching on of a selected number of its circuits.

Still further, the present invention, is directed to achieving this reduction in inductance by selectively interconnecting the power supply paths of active or inactive chips.

These and other objectives and features of the present invention will become apparent from the following description taken in conjunction with the drawings.

DESCRIPTION OF THE PREFERRED EMBODIMENT

Figure 1:
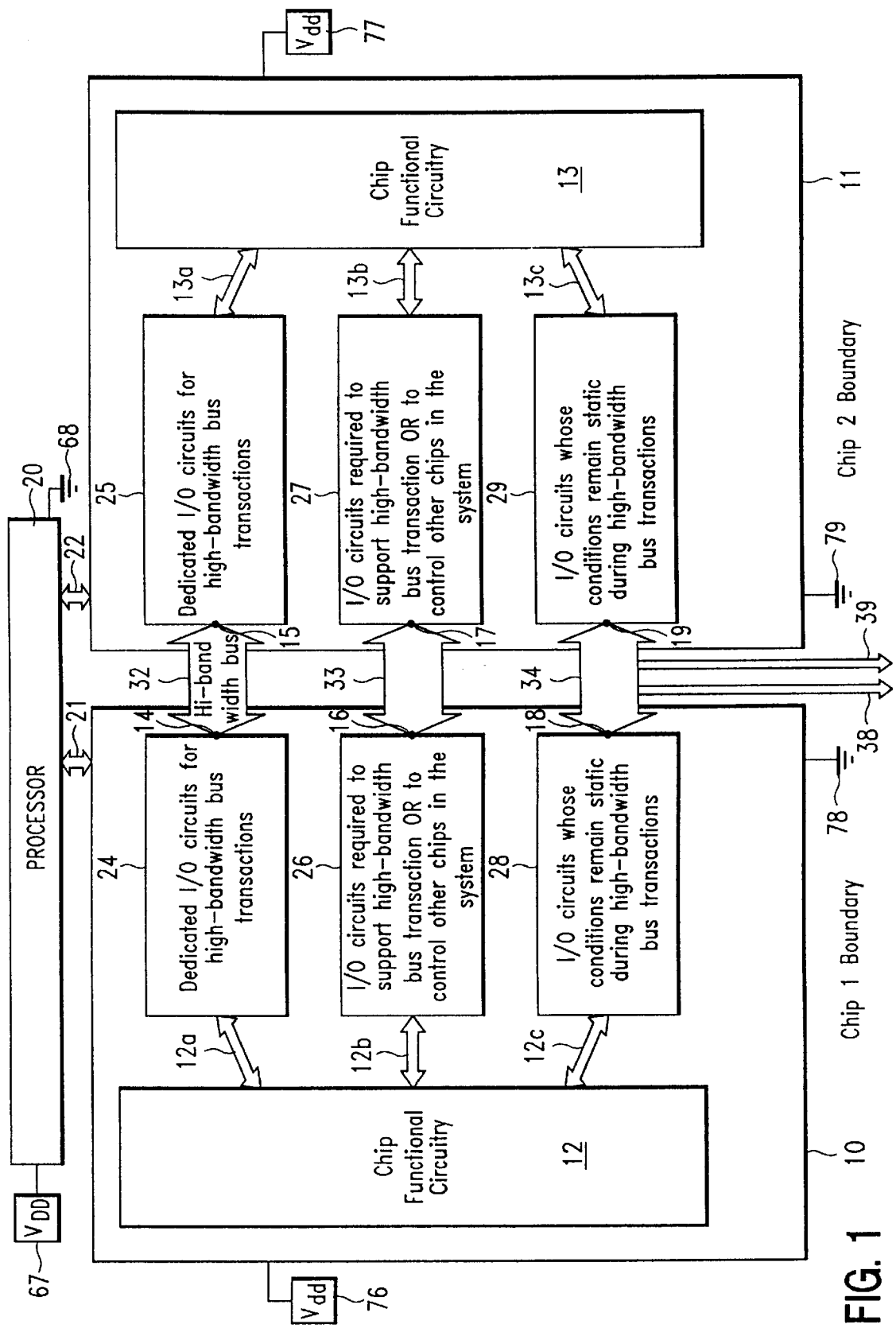
FIG. 1 is a block diagram illustrating how logic chips are typically arranged in a computer.

FIG. 1 is a block diagram illustrating how a processor and integrated circuit chips are typically arranged in a computer. Although a computer requires additional devices and circuits for operation, such devices and circuits, their purposes and their interconnections are well known to the art and thus they need not be discussed herein. Further, although in the typical computer, hundreds or thousands of such chips may be employed, for ease of understanding of the invention, the present invention will be described using only a processor and two integrated circuit chips and their interconnections.

Specifically, FIG. 1 shows a processor 20 coupled to a pair of chips 10 and 11 via signal buses 21 and 22. The processor 20 is also coupled to a positive system or global voltage source or power supply ($V_{DD}$) 67 and to a second system or global voltage source or power supply 68. It should be noted that although this second system or global voltage source 68 is shown here as ground it can be either a positive or a negative voltage power supply, instead of ground. The chips 10 and 11 are further coupled to one another via communication busses 32, 33 and 34. Each chip 10, 11 typically has thereon respective first and second local or on-chip power supplies, a respective functional circuitry block which is connected though sets of driver or amplifier circuits and chip Input/Outputs (I/Os) to busses connecting one chip to the other chip or to other system circuits (not shown). Specifically, the chip 10 is coupled to the processor 20 via bus 21, to a first chip voltage source or power supply ($V_{dd}$) 76 and to a second chip voltage source or power supply 78. It should be noted that although this second chip voltage source or power supply 78 is shown here as ground it can be either a positive or a negative voltage power supply, instead of ground. These on-chip power supplies are local power supplies on each and every chip and are separate and distinct from the global power supplies which are shared by all the chips as well as the processor.

The chip 10 is provided with a functional circuitry block 12 which is coupled to a plurality of dedicated I/O circuits 24, 26, and 28. The chip 11 is coupled to the processor 20 via bus 22, to a first chip voltage source ($V_{dd}$) 77 and to a second chip voltage source 79. Again it should be noted that although this second chip voltage source 78 is shown here as ground it can be either a positive or a negative voltage power supply, instead of ground. The chip 11 is provided with a functional circuitry block 13 which is coupled to: a plurality of dedicated I/O circuits 25, 27 and 29, selected ones of a plurality of dedicated I/O circuits 25, 27, and 29, to a first chip voltage source ($V_{dd}$) 77 and to a second chip voltage source 79. It should be noted that although these second chip voltage sources 78 and 79 are shown as ground they can be either positive or negative voltage power supplies, instead of ground.

The blocks of functional circuitry 12, 13 can comprise a plurality of logic circuits such as, (but not limited to) AND, NAND, OR, NOR, and NOT circuits. As shown in FIG. 1, functional circuit block 12, of chip 10, is coupled to the chip output points 14, 16, and 18 through respective sets of dedicated I/O circuits 24, 26, and 28. Similarly, functional circuit block 13, of chip 11, is coupled to the chip output points 15, 17, and 19 via respective sets of dedicated I/O circuits 25, 27 and 29. Each of these I/O circuit sets 24, 25, 26, 27, 28 and 29 comprise a plurality of driver or amplifier circuits as will, in conjunction with FIG. 2, be discussed in detail below.

Specifically the functional circuitry block 12 on chip 10 is coupled to an I/O circuit set 24, for high-bandwidth bus transactions, via bus 12a, to I/O circuit set 26, required to support high-bandwidth bus transactions or to control other chips in the system, via bus 12b and to I/O circuit set 28, whose conditions remain static during high-bandwidth bus transactions, via bus 12c. Similarly functional circuitry block 13 on chip 11 has coupled via bus 13a to a dedicated I/O circuit set 25 for high bandwidth bus transactions, to a dedicated I/O circuit set 27, required to support high-bandwidth bus transactions or to control other chips in the system, via bus 13b and to a dedicated I/O circuit set 29, whose conditions remain static during high-bandwidth bus transactions, via bus 13c. The sets of dedicated I/O circuits for high bandwidth bus transactions 24 and 25 are interconnected to one another by the high-bandwidth bus 32. The sets of I/O circuits 26 and 27, required to support high-bandwidth bus transactions or to control other chips in the system, are similarly connected to one another by the interconnecting communication bus 34. While the sets 28 and 29 of I/O circuits whose conditions remain static during high-bandwidth bus transactions 26 and 27 each are similarly connected to one another by an interconnecting communication bus 34 and also directed off chip via respective Input/Output (I/O) buses 38 and 39.

Figure 2:
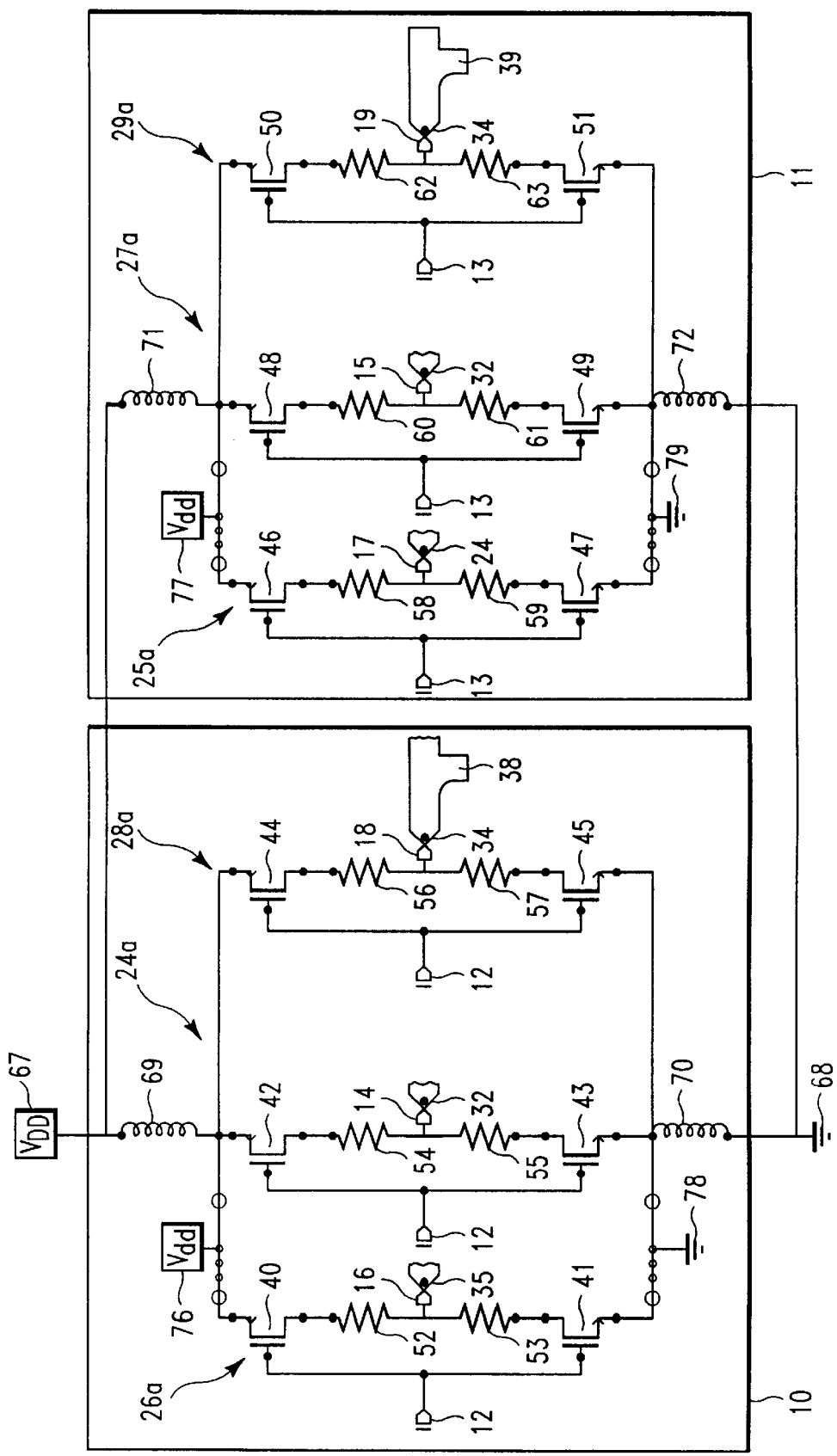
FIG. 2 is a schematic circuit of the block diagram of FIG. 1 together with the parasitic inductances that contribute to voltage bounce during operation of the arrangement shown in FIG. 1.

FIG. 2 schematically represents the block diagram of FIG. 1 together with the parasitic inductances that exist during the operation of such logic chips. It is these parasitic inductances that contribute to voltage bounce during operation of these logic chips when they are arranged as shown in FIG. 1.

Although each set of I/O circuits shown in FIG. 1 may contain dozens or even hundreds of driver circuits, in FIG. 2, for purposes of Illustration only, single drivers are used to represent each of the respective sets of I/O circuits 24 to 29. Thus, the set 24, of dedicated I/O circuits for high bandwidth bus transactions, the set 26, of I/O circuits required to support high-bandwidth bus transactions or to control other chips in the system, and the set 28, of I/O circuits on chip 11 whose conditions remain static during high-bandwidth bus transactions, are respectively and schematically represented by driver circuits 24a, 26a and 28a. Similarly, the set 25, of dedicated I/O circuits for high bandwidth bus transactions, the set 27, of I/O circuits required to support high-bandwidth bus transactions or to control other chips in the system, and the set 29, of I/O circuits whose conditions remain static during high-bandwidth bus transactions, are respectively and schematically represented as driver circuits 25a, 27a, and 29a.

Each of the above driver circuits 24a, 26a, and 28a of chip 10 consists respectively of a pair of complementary transistors 40 and 41, 42 and 43, and 44 and 45 and may include a pair of resistors 52 and 53, 54 and 55, and 56 and 57 serially coupled between the on-chip voltage sources 76 and 78 for matching the output impedance of the driver to the line interconnecting chips 10 and 11. Each driver circuit 24a, 26a, 28a is coupled to a respective one of the outputs 14, 16, or 18. Each driver circuit comprises a P-type transistor (PFET) coupled between the first local or on-chip voltage source 76 ($V_{dd}$) and the first one of the pair of resistors which is coupled to an output bus and through the second one of the pair of resistors and an N-type Field Effect Transistor (NFET) to the second local or on-chip voltage source 78 (ground). Thus driver circuit 26a comprises a PFET 40 and an NFET 41 which transistors are in series with one another and with the resistors 52 and 53 between the local or on-chip voltage sources, driver circuit 24a is similarly comprised of PFET 42 and an NFET 43 in series with one another and with the resistors 54 and 55 between the local or on-chip voltage sources, and driver circuit 28a is also comprised of a PFET 44 and an NFET 45 in series with one another and with the resistors 54 and 55 between the local or on-chip voltage sources. The output of each driver circuit is coupled to the juncture of the resistors. That is, the output 16 of driver circuit 26a is at the juncture of resistors 52 and 53, the output 14 of driver circuit 24a is at the juncture of resistors 54 and 55, and the output 18 of driver circuit 28a is at the juncture of resistors 56 and 57.

Each of the driver circuits 25a, 27a, and 29a of chip 11 also respectively consists of a pair of complementary transistors and a pair of resistors serially coupled between the local or on-chip voltage sources 77 and 79. Each of the above driver circuits 25a, 27a, and 29a of chip 11 consists respectively of a pair of complementary transistors 46 and 47, 48 and 49, and 50 and 51 and may also include a pair of resistors 58 and 59, 60 and 61, and 62 and 63, serially coupled between the local or on-chip voltage sources 77 and 79. Each driver circuit 25a, 27a, 29a is coupled to a respective one of the outputs 15, 17, or 19. Specifically, the transistors 46, 48, and 50 are PFETs and transistors 47, 49, and 51 are NFETs. Each driver circuit is comprised of a PFET coupled between the first local or on-chip voltage source 77 ($V_{dd}$) and the first one of the pair of resistors which is coupled to an output bus and through the second one of the pair of resistors and an (NFET) to the second local or on-chip voltage source 79 (ground). Thus driver circuit 27a is comprised of a PFET 46 and an NFET 47 in series with one another and with the resistors 53 and 54 and between the local or on-chip voltage sources, driver circuit 25a is comprised of PFET 48 and NFET 49 which are in series with one another and with the resistors 60 and 61 and between the local or on-chip voltage sources, and driver circuit 29a is comprised of PFET 50 and NFET transistor 51 in series with one another and with the resistors 62 and 63 and between the local or on-chip voltage sources. The output of each driver circuit is coupled to the juncture of the resistors. That is, the output 17 of driver circuit 25a is at the juncture of resistors 58 and 59, the output 15 of driver circuit 27a is at the juncture of resistors 60 and 61, and the output 19 of driver circuit 29a is at the juncture of resistors 62 and 63.

Because, as described above, these driver circuits can number in the hundreds large numbers of I/O points can be required to switch simultaneously. The total current required to charge and discharge the load capacitances connected to each of the switching I/O points flows through the power supply leads which have a finite inductance associated therewith. The instantaneous in current which flows in this inductance at the moment the driver switches creates a voltage bounce which is proportional to the rate of change of the driver current and the inductance in series with the power supply leads. With large numbers of drivers switching on simultaneously the resultant DC shift in the supply potential will degrade the noise margins on the chip. This problem becomes exacerbated as the local or on-chip power supplies voltages decrease.

The current required to charge and discharge this load capacitance connected to the I/O points flow from the chip driver local or on-chip power supplies, on each activated chip, to the system or global power supplies 67 and 68 appears in the parasitic inductances 69, 70, 71 and 72.

The present invention overcomes the above described problems encountered in reducing the problem of voltage noise or bounce and does so in a practical way without impacting on circuit performance or speed.

Broadly this reduction in voltage bounce is achieved by forcing the I/O points, of those chips not being activated, i.e., those not switched on, to serve as alterative paths to the local or on chip voltage or power supply used by the activated circuits, i.e., those circuits switched on.

Figure 3:
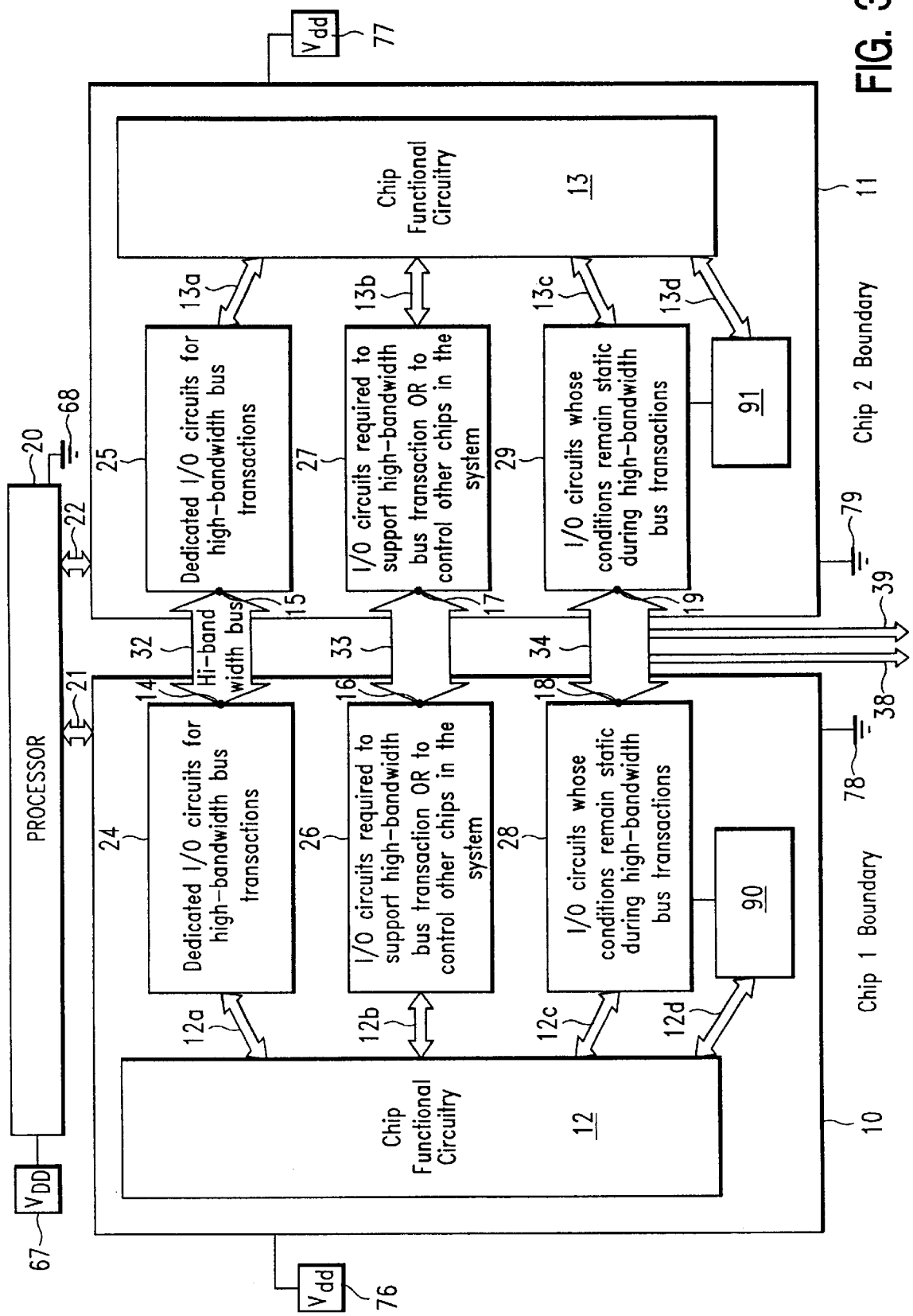
FIG. 3 is a block diagram of the how the logic chips of FIG. 1 must be modified to realize the present invention.
Figure 4:
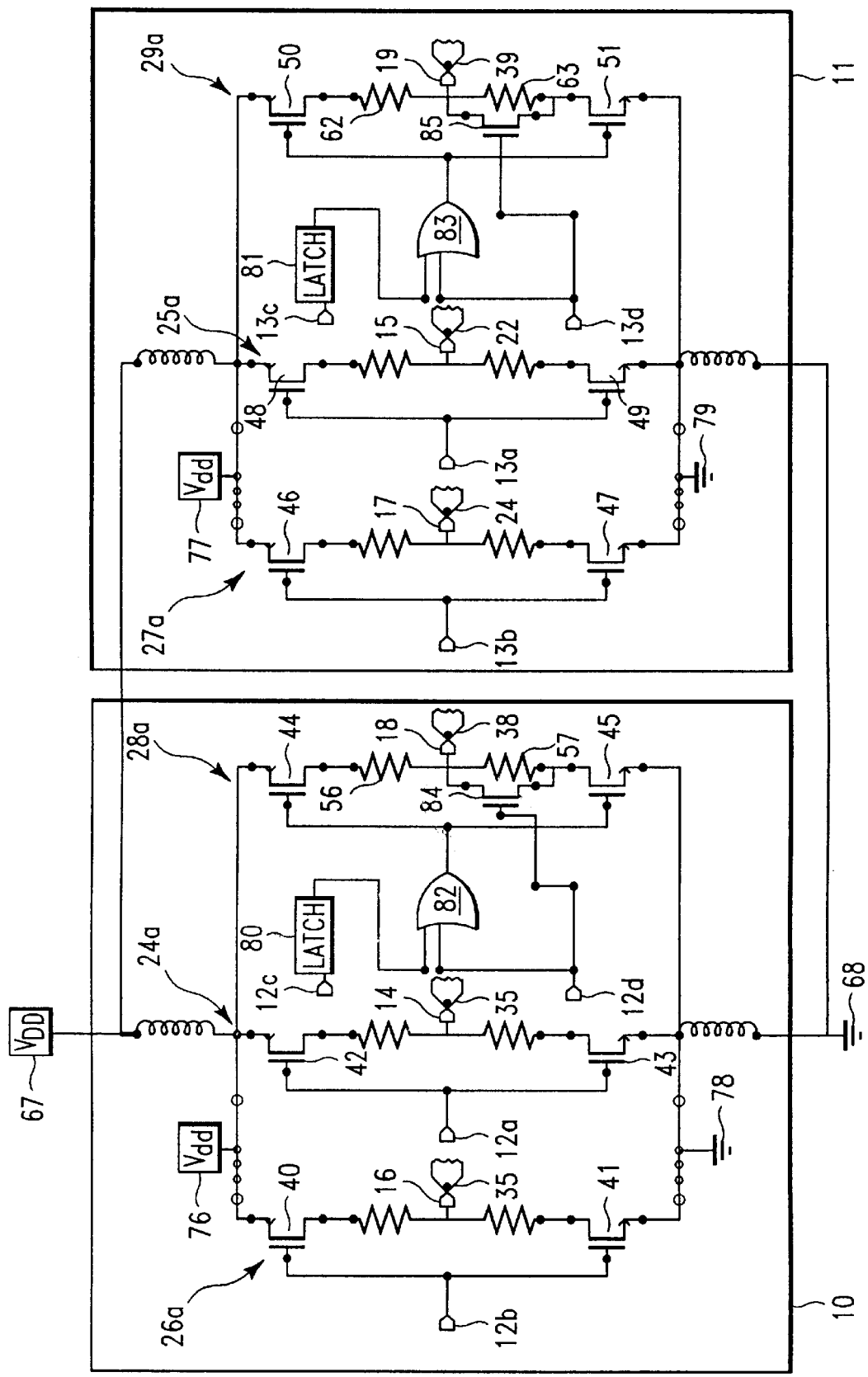
FIG. 4 is a schematic circuit of the block diagram of FIG. 3 showing in detail the latching circuit, required by the present invention for the ground or negative supply lead.
Figure 5:
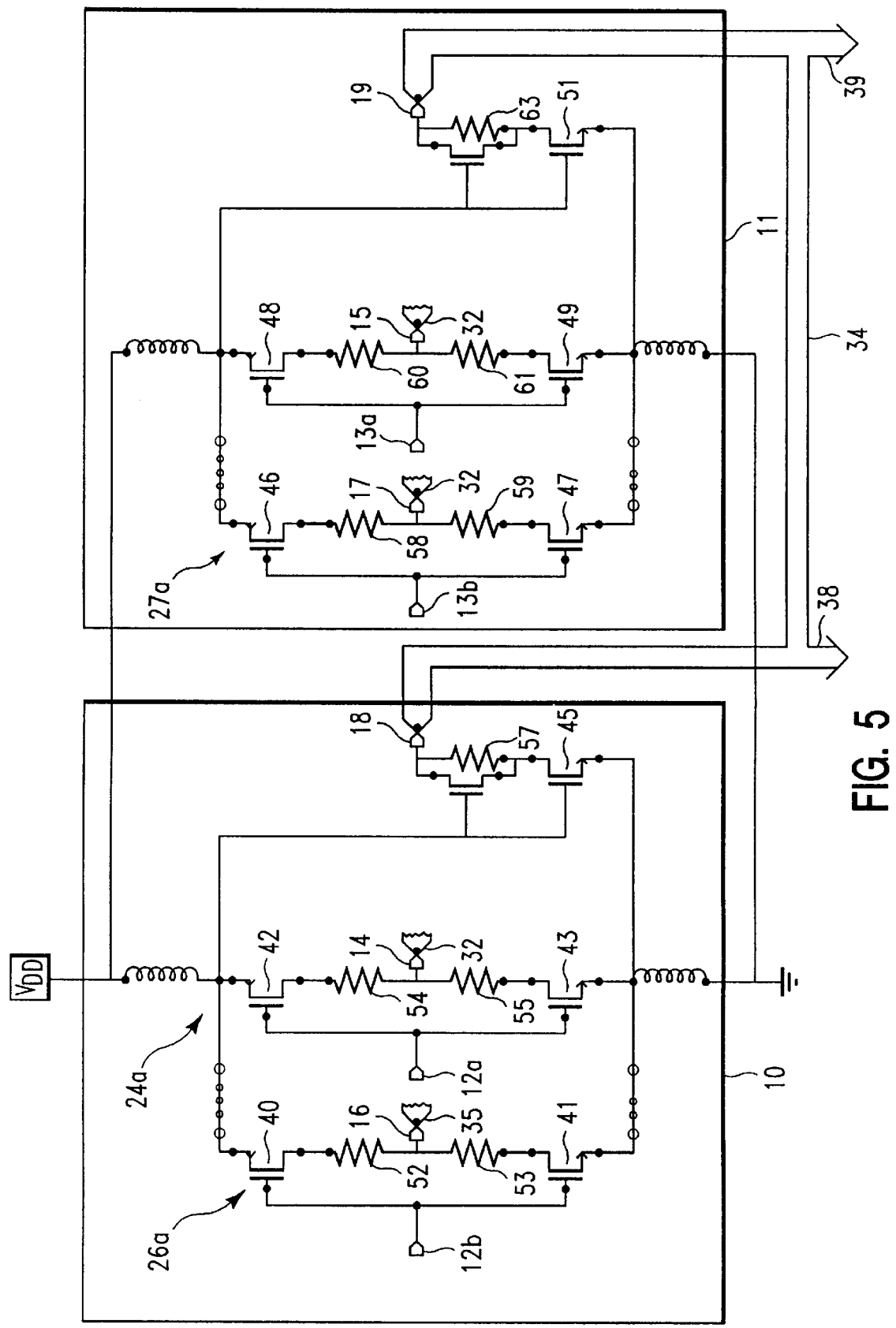
FIG. 5 shows the schematic circuit of FIG. 4 with the latching circuit activated and the chips interconnected in accordance with the present invention so that the parasitic inductances that contribute to voltage bounce in the circuit are reduced.

Turning now to FIGS. 3, 4 and 5, the present invention will be described in detail. FIG. 3 is a block diagram of the how the logic chips of FIG. 1 must be modified to realize the present invention, FIG. 4 is a schematic circuit of the block diagram of FIG. 3 showing in detail the additional circuit elements that effect a reduction in the above discussed chip I/O inductances and thus a reduction in the voltage bounce of the circuit during switching. FIG. 5 shows the schematic circuit of FIG. 4 with the additional elements activated and the chips interconnected in accordance with the present invention so that the parasitic inductances that contribute to voltage bounce in the circuit are reduced.

Broadly the present invention groups the I/O points on the chips into logical, functional units and provides means for interconnecting the I/O points on switched circuits, i.e., those circuits switched on at high frequency, and the I/O points on static circuits, i.e., those circuits not switched on at high frequency, such that the I/0 points on the static circuits serve alternate paths to the power supply used by the switched circuits. In this way the inductance in the switched I/O points is substantially reduced such that voltage bounce in the circuit is also substantially reduced while maintaining the desired circuit speed.

It should be remembered that all the static I/O points on a chip are connected, via card signal lines, to other chips in the system which have their own static I/O points to the signal lines. The present invention achieves reduced inductance and voltage bounce by forcing the static I/O drivers on an activated chip, i.e., that chip with the high frequency bus switching requirements, to simultaneously drive at the same voltage level, for example, ground, as the static I/O drivers on an inactive chip. In this way an alternate path is created for the ground current caused by the high frequency bus switching.

FIG. 3 shows the system of FIG. 1 modified to accommodate the present invention. In this FIG. 3 those items Identical to those shown in FIG. 1 are identified by the same number as that used in FIG. 1. Thus, there is shown a processor 20 coupled to chips 10 and 11 via signal buses 21 and 22. The processor 20 is coupled to a positive system or global voltage source ($V_{DD}$) 67 and to a second system or global voltage source 68 which again can be either a positive or a negative voltage supply, instead of ground. The chips 10 and 11 are again coupled to one another via communication busses 32, 33 and 34 and each has thereon respective first and second chip voltage supplies, a respective functional circuitry block which is connected though sets of driver or amplifier circuits and chip input/outputs (I/Os) to busses connecting one chip to the other chip or to other system circuits or chips (not shown).

Now however each functional circuitry block 12 and 13 has provided thereon an additional assist output 12d, 13d that can provide an assist signal to the added inductance reduction circuitry 90, 91 required by the present invention. The assist signal is used to create the previously described alternate path for power supply current.

In FIG. 4, the added induction reduction circuitry 90, 91 required by the present invention is coupled to the static driver circuit, on each chip 10 and 11 and comprises a respective latch, a respective two input OR gate and a respective FET switch. It should also be noted that this FIG. 4 sets forth the schematic and addresses the reduction in the supply inductance for the ground or negative supply lead. Thus. chip 10 has a latch 80, to hold the state of any control signal received from the processor 12, a logic control circuit such as an OR gate 82, and an FET 84 added thereto in accordance with the invention. In a like manner chip 11 has a latch 81, a logic control circuit such as an OR gate 83, and an FET 85 added thereto in accordance with the invention.

The input of the latch 80 is coupled to the functional circuitry block 12 via bus 12c to hold the state of any control signal received from the processor 12. The output of the latch 80 is coupled to the first one of the inputs to the OR gate 82 and though the OR gate 82 to the input of the static I/O driver 28a, i.e., the gates of transistors 44 and 45. The second input of the OR gate 82 is coupled to the output 12d of the functional circuitry block 12 as is the gate of FET transistor 84 which is connected across the termination resistor 57. By connecting the output of the OR gate 82 to the input of the static I/O driver 28a, any output of the static driver 28a can be forced into a specific state in response to an assist signal from the processor while the FET switch 84 shorts out any the termination resistance (resistor 57) in the static I/O driver 28a. In a like manner the latch 81 is in series with the logical input from the functional circuitry block 13, via bus 13c, to the static I/O driver 29a to hold the state of the control signal received from the processor. The OR gate 82 is coupled to bus 13d to force the output of driver 29a into a specific state in response to an assist signal from the processor. The FET switch 84 shorts out any termination resistance (resistor 63) in each static I/O driver.

The invention operates as follows The processor 20 issues a command for the system chips to prepare for a high frequency bus interaction between the chips. The main chip functional circuitry on each chip 10 and 11, receiving the processor commands, issues, via the inductance reduction circuit 90, 91, a signal to selected driver circuits on each chip, i.e., those driver circuits whose condition remain static during high bandwidth transmissions and simultaneously initiates an assist signal to the induction reduction circuitry. Thus in FIG. 3, the main chip functional circuitry 12, 13 on each chip, 10, 11 would receive such a command from the processor 20 and each issues, from its functional circuitry block 12, 13 a respective signal, via respective busses 12c, 13c, to their respective latches 80, 81 to latch the current state of their control lines. Simultaneously the same functional circuitry block 12, 13 on each chip 10, 11 issues an assist command on the assist bus 12d, 13d. This assist command is fed to the second input on the OR gate 82, 83 on the chip 10, 11 and to the gate of the FET switch 84, 85.

When the assist signal is asserted, FET switches 84, 85 and the NFETs 45 and 51 become turned on and the PFETs 49 and 50 becomes turned off. In this way, static drivers 28a and 29a act as an alternate parallel path to the system power supply for the chips 10 and 11 thus reducing the inductance in series with supplies 78 and 79.

Thus the present invention describes a means of interconnecting, without adding circuit elements that will adversely alter the circuit speed, the I/O points on a chip having a switched circuit, i.e., a circuit switched on at high frequency, to the I/O points on a chip having a static circuit, i.e., a circuit not switched on at high frequency, so that the switched circuit will be coupled to both its own local or on-chip power supplies and to the local or on-chip power supplies of the static circuits and thus reducing the inductance of the switched circuit and the voltage bounce of its output signal.

It should be clearly understood that the alternate current path provided by the present invention also has inductance associated with it and thus the total inductance of the main supply path and the alternate path provided by the present invention is given by:

$$L_{Total} = L_1 L_2 / L_1 + L_2.$$

This total inductance $L_{Total}$ is always smaller than the smaller of the two inductances $L_1$ and $L_2$. Since the supply inductance is typically made small by design, a large number of alternate paths need to be activated in order to have a significant impact on the total system inductance. However because in a chip there are hundreds of driver circuits and only a relatively small number of them will be active there will more than enough static drivers on any given chip, which when operated, in accordance with the present invention, to cause the system to realize a significant and noticeable reduction in inductance.

Figure 6:
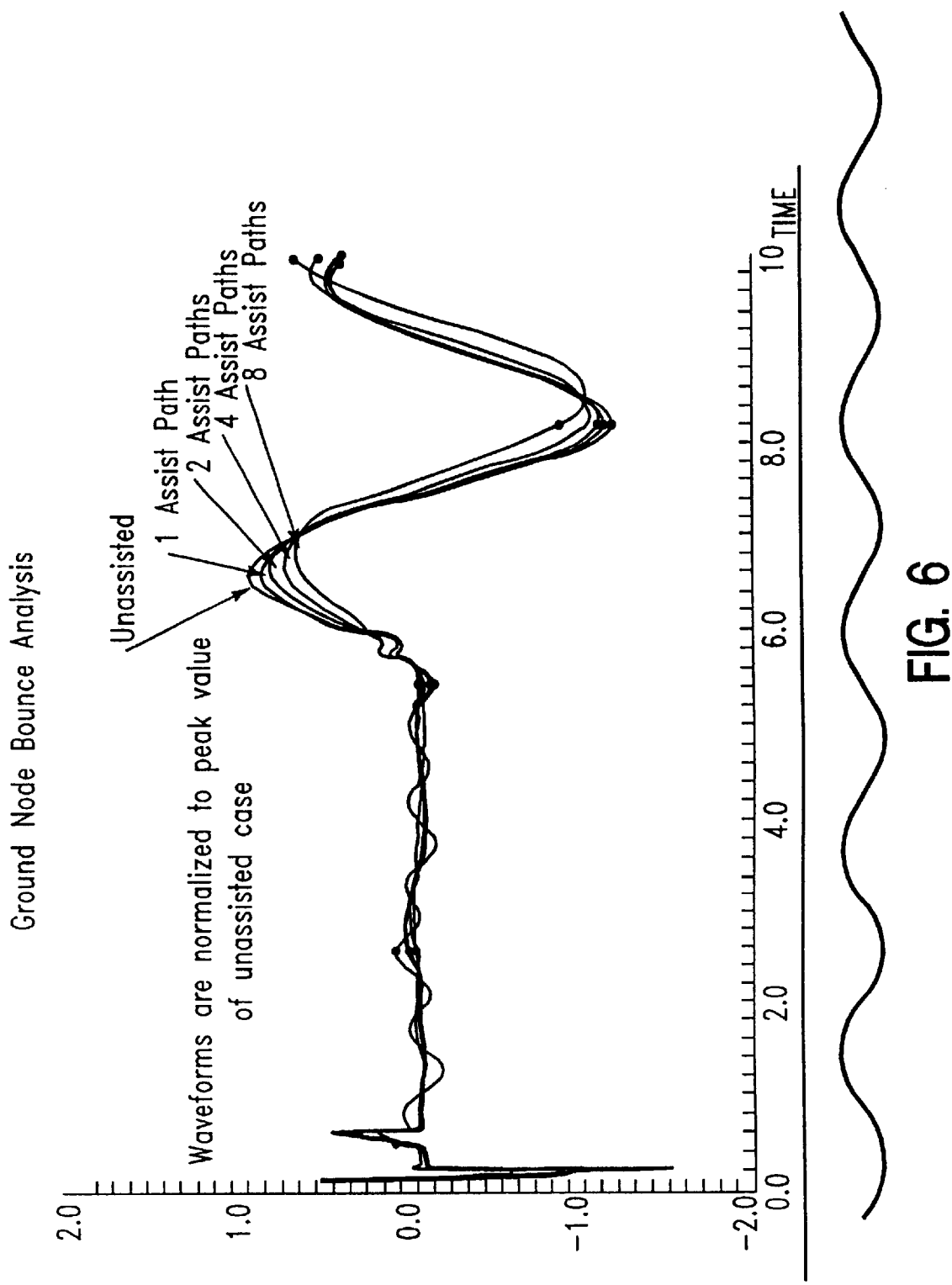
FIG. 6 is a chart showing a voltage bounce analysis for the apparatus shown in FIGS. 4 and 5.

FIG. 6 is a chart showing a voltage bounce analysis for the apparatus shown in FIGS. 4 and 5. In this FIG. 6 the waveform "unassisted" depicts the ground node or voltage bounce of a circuit of the prior art without using the latch of the present invention therein. While the waveforms 1 assist path, 2 assist paths, 4 assist paths, 8 assist paths, show the improved results from using the present invention with the number of assist paths indicated. Since hundreds of such assist paths can be employed in a computer, it is quite apparent that a significant improvement in voltage bounce can be realized by using the present invention.

Figure 7:
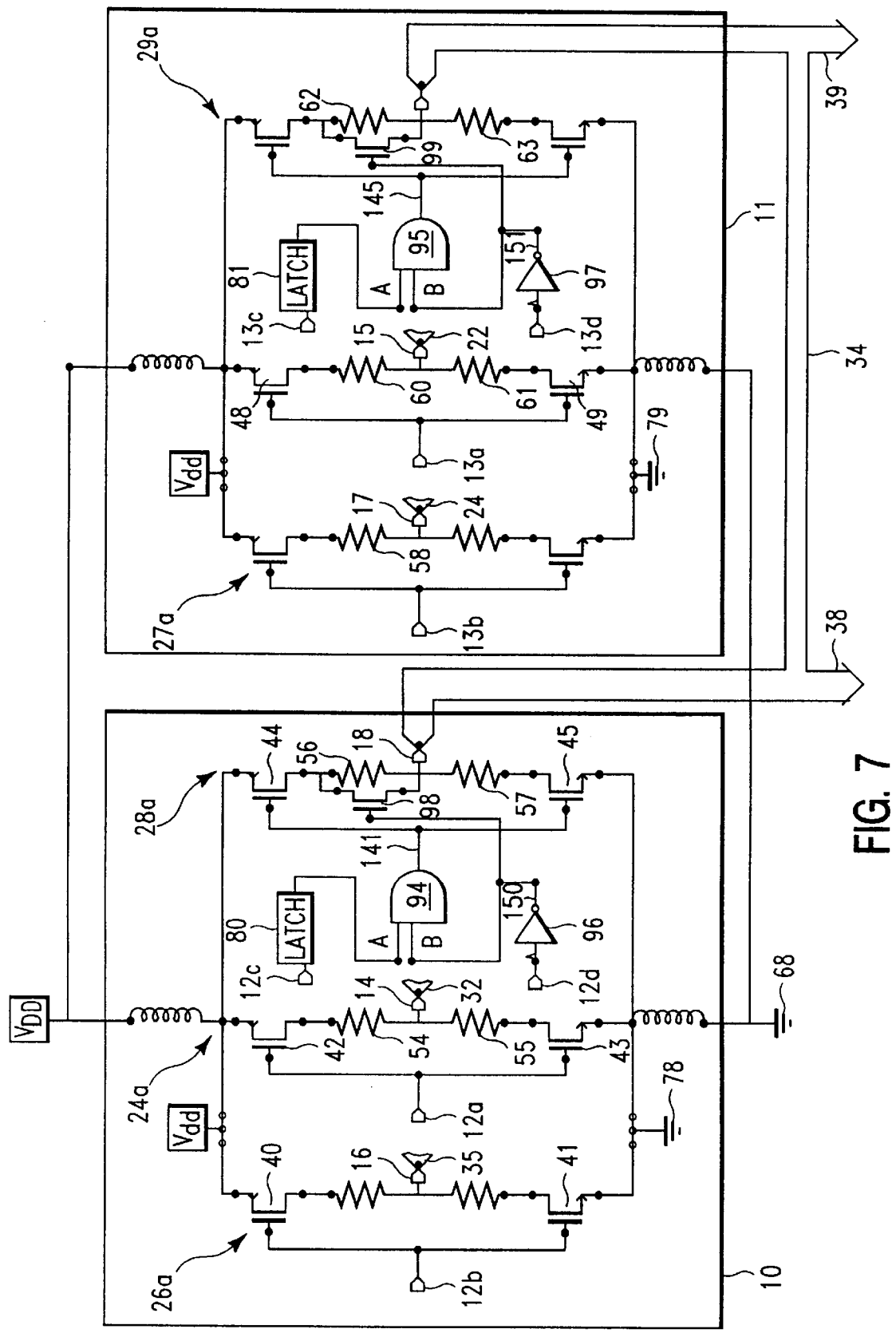
FIG. 7 is a schematic circuit of the block diagram of FIG. 3 showing in detail the latching circuit, required by the present invention for the positive supply lead.

FIG. 7 is a schematic circuit of the block diagram of FIG. 3 showing in detail the latching circuit, required by the present invention to achieve the desired reduction in the positive supply inductance. Thus, FIG. 7 sets forth a schematic that reduces the inductance in series with the positive supply lead and addresses the circuitry by using the positive supply lead. In this embodiment the driver NFETs would be turned off, the resistor in series with the PFETs shorted and the PFETs turned on and this is accomplished by substituting an AND gate for the OR gate shown in FIG. 4.

In this FIG. 7, the added inductance reduction circuitry 90, 91 required by the present invention is coupled to the static driver circuit, on each chip 10 and 11 and comprises a respective latch, a respective logic control circuit, such as a two input AND gate, and a respective FET switch. It should also be noted that this FIG. 7 sets forth the schematic and addresses the reduction in the supply inductance for the positive supply lead. Thus, chip 10 has a latch 80, to hold the state of any control signal received from the processor 12, an AND gate 94, an inverter circuit 96 and an FET 98 added thereto in accordance with the invention. In a like manner chip 11 has a latch 81, an AND gate 95, an inverter circuit 97 and an FET 99 added thereto in accordance with the invention.

The input of the latch 80 is coupled to the functional circuitry block 12 via bus 12c to hold the state of any control signal received from the processor 12. The output of the latch 80 is coupled to the first one of the inputs to the AND gate 94 and though the AND gate 94 to the input of the static I/O driver 28a, i.e., the gates of transistors 44 and 45. The second input of the AND gate 94 is coupled to the output 12d of the functional circuitry block 12 through an inverter circuit 96 and to the gate of FET transistor 98 which is connected across the resistor 56. By connecting the output of the AND gate 94 to the input of the static I/O driver 28a, any output of the static driver 28a can be forced into a specific state in response to an assist signal from the processor while the FET switch 98 shorts out any the termination resistance (resistor 56) in the static I/O driver 28a. In a like manner the latch 81 is in series with the logical input from the functional circuitry block 13, via bus 13c, and coupled to the static I/O driver 29a to hold the state of the control signal received from the processor. The AND gate 95 is coupled to bus 13d to force the output of driver 29a into a specific state in response to an assist signal from the processor. The FET switch 99 shorts out any termination resistance (resistor 62) in each static I/O driver. Thus, FIG. 7 sets forth a schematic that reduces the inductance in series with the positive supply lead and addresses the circuitry by using the positive supply lead.

It should also be understood that although the driver circuits in the above description are shown with termination resistors therein that different driver circuits not using such termination resistors can be used. In such an event the induction reduction circuit can be simplified in that the switching FET therein could be eliminated.

This completes the description of the preferred embodiment of the invention.

Since other changes, alternatives and modifications will now become apparent to those skilled in the art without departing from the spirit and scope of the invention described herein, it is intended that all the matter contained in the above description or shown in the accompanying drawings will be interpreted in an illustrative sense and not in a limiting sense.

What is claimed is:

1. A method for reducing inductance between a plurality of integrated circuit chips, each of said chips having a first on-chip power supply and a second on-chip power supply, a functional circuit block coupled to an induction reduction circuit, a first of set of I/O circuits coupled to a first plurality of input/output points and a second of set of I/O circuits coupled to a second plurality of input/output points and said induction reduction circuit comprising the steps of:

connecting the first on-chip power supply, connected to a first integrated circuit of said plurality of integrated circuit chips, to the first on-chip power supply connected to selected ones of the remaining plurality of integrated circuit chips;

connecting the second on-chip power supply, connected to said first integrated circuit of said plurality of integrated circuit chips, to the second on-chip power supply connected to selected ones of the remaining plurality of integrated circuit chips;

activating a selected fist set of I/O circuits on a selected one of said plurality of integrated circuit chips, maintaining the second set of I/O circuits on selected ones of said plurality of integrated circuit chips In an inactive state, and activating said induction reduction circuits on each chip of said plurality of integrated circuit chips having a second set of I/O circuits maintained in an inactive state to connect he plurality of I/O points coupled to the activated first set of I/O circuits on said selected one of said plurality of chips to the plurality of I/O points coupled to said inactive second set of I/O circuits on each of said chips.

2. A method for reducing inductance between a plurality of integrated circuit chips, each of said chips having a fist on-chip power supply and a second on-chip power supply , a functional circuit block coupled to an induction :reduction circuit, a first of set of I/O circuits coupled to a first platy of input/output points and a second of set of I/O circuits coupled to a second plurality of input/output points and said induction reduction circuit comprising the steps of:

connecting the first on-chip power supply of the first integrated circuit chip, of said plurality of integrated circuit chips, in parallel to the first on-chip power supply connected to selected ones of the remaining plurality of integrated circuit chips;

connecting the second on-chip power supply of the first integrated circuit chip, of said plurality of integrated circuit chips, in parallel to the second on-chip power supply connected to selected ones of the remaining plurality of integrated circuit chips;

activating a selected fast set of I/O circuits on a selected one of said plurality of integrated circuit chips, maintaining the second set of I/O circuits on selected ones of sand plurality of integrated circuit chips in an inactive state, and activating &Ad induction reduction circuits on each chip of sad plurality of integrated circuit chips having a second set of I/O circuits maintained in an inactive state to conned the plurality of I/O points coupled to the activated first set of I/O circuits on said selected one of said plurality of chips to the plurality of I/O points coupled to said inactive second set of I/O circuits on each of said chips.

3. In a computer:

a processor coupled to first and second system voltage sources;

a plurality of integrated logic circuit chips coupled to said processor;

each of said chips having respective first ad second on-chip voltage sources;

each of sad chips comprising:
  a block of functional circuitry;
  a first group of dedicated high bandwidth Input/Output circuits coupled to said block of functional circuitry and to a respective Input/Output bus;
  a second group of Input/Output circuits, for supporting the first group of high bandwidth Input/Output circuits, coupled to said block of functional circuitry and to a respective Input/Output bus;
  a third group of Input/Output circuits, whose conditions remain static during high bandwidth bus transactions, coupled to said block of functional circuitry and to a respective Input/Output bus; and
  an inductance reduction circuit coupled to said block of functional circuitry and to said third group of Input/Output circuits to force fie Input/Output points of said third group of circuits to serve as alterative paths to the on-chip voltage sources used by said first group of circuits to reduce inductance in said first group of circuits without adversely impacting on circuit speed.

4. The computer of claim 3 wherein each circuit in said third group of Input/Output circuits comprises:

a driver circuit comprising a pair of complementary Field Effect Transistors having respective control gates;

said pair of complementary Field Effect Transistors being connected in series between the first and second on-chip voltage sources;

one transistor of said pair of complementary Field Effect Transistors being further coupled to the first one of said on-chip voltage sources and to an Input/Output point on said chip; and the other transistor of said pair of complementary Field Effect Transistors being further coupled to the second one of said on-chip voltage sources and said Input/Output point on said chip.

5. In a computer:

a processor coupled to first and second system voltage sources;

a plurality of integrated logic circuit chips coupled to said processor, each of said chips having respective first and second on-chip voltage sources;

each of said chips comprising:
  a block of fictional circuitry;
  a first group of dedicated high bandwidth Input/Output circuits coupled to said block of functional circuitry and to a respective Input/Output bus;
  a second group of Input/Output circuits, for supporting the firs group of high bandwidth InputOutput circuits, coupled to said block of functional circuitry and to a respective Input/Output bus;
  a third group of Input/Output circuits, whose conditions remain static dug high bandwidth bus transactions, coupled to said block of functional circuitry and to a respective input/output bus; and
  an inductance reduction circuit coupled to said block of functional circuitry and to said third group of Input/Output circuits to force the Input/Output points of said third group of circuits to serve as alterative paths to the on-chip voltage sources used by said firs group of circuits to reduce inductance in said first group of circuits without adversely impacting on circuit speed, wherein each of said circuits in said third group of Input/Output circuit comprises:
    a driver circuit comprising a pair of complementary Field Effect Transistors having respective control gates and a pair of termination resistors;
    said pair of complement Field Effect Transistors and said pair of termination resistors being connected in series between the first and second on-chip voltage sources;
    one transistor of sad pair of complementary Field Effect Transistors and one termination resistor of said pair of termination resistors being further coupled to the first one of said on-chip voltage sources and to an Input/Output point on said chip; and
    the other transistor of said pair of complementary Field Effect Transistors and the other termination resistor of said pair of termination resists being further coupled to the second one of said on-chip voltage sources and to said Input/Output point on said chip.

6. The computer of claim 5 wherein:

the termination resistors are coupled to each other in series and have a juncture therebetween and are further coupled between said complementary transistors; and the juncture between the termination resistors is coupled to said Input/Output point on said chip.

7. The computer of claim 6 wherein there is further provided an inductance reduction circuit comprising a switching FET, having a control gate, coupled across a first of said termination resistors in said third group of Input/Output circuits;

a latch holding the state of any control signal received from the processor, having an input and an output;

a logic control circuit having first and second inputs and an output;

the input of the latch being coupled to the processor and the output of the latch being coupled to the first input of the logic circuit;

the logic control circuit having said second input coupled to an assist signal output from said processor input and said output coupled to the respective control gates of said pair of complementary Field Effect Transistors for correlating any signal applied to said latch and any assist signal from the processor to switch on one of said pair of complementary Field Effect Transistors and to switch off the other of said pair of complementary transistors;

the switching FET being coupled across one of said termination resistors; and the control gate of the switching FET being coupled to said processor assist signal output such that the switching on of said switching FET will short circuit the said first one of termination resistors.

8. The computer of claim 7 wherein said logic control circuit is an OR circuit.

9. The computer of claim 8 wherein said logic control circuit is an AND circuit.

10. The computer of claim 7 wherein said inductance reduction circuit further includes an inverter circuit.

* * * * *